Aug. 18, 1970 J. A. BOURGET 3,525,046

SINGLE LOCAL OSCILLATOR FOR DUAL CONVERSION SYSTEM

Filed April 6, 1966

INVENTOR
JOSEPH A. BOURGET

BY Beale and Jones
ATTORNEYS

United States Patent Office 3,525,046

Patented Aug. 18, 1970

3,525,046
SINGLE LOCAL OSCILLATOR FOR DUAL CONVERSION SYSTEM

Joseph A. Bourget, Glencoe, Md., assignor to Chesapeake Systems Corporation, Cockeysville, Md., a corporation of Maryland Filed Apr. 6, 1966, Ser. No. 540,610
Int. Cl. H04b *1/26*
U.S. Cl. 325—434 10 Claims

ABSTRACT OF THE DISCLOSURE

A dual frequency conversion system utilizing a single local oscillator is disclosed. The output of the local oscillator is a fixed frequency which is applied to a mixer together with a received signal. The mixer output contains the signal frequency, the local oscillator frequency and the sum and difference of these two frequencies, as well as certain harmonics and image frequencies, all of which are applied to a trap which is tuned to pass only the local oscillator frequency and the difference (or sum) frequency. The second mixer then mixes the two preserved signals to produce second sum and difference signals which are filtered to produce the desired output.

The present invention relates to frequency conversion techniques and, more specifically, to a dual conversion system for radio receiver application.

As is well known, the basic operation of a superheterodyne receiver circuit involves the conversion of radio frequency input signals to a lower intermediate frequency (IF). The intermediate frequency usually has a value below the carrier frequency of the selected incoming signal and this latter signal, with its audio modulation, is converted to the fixed intermediate frequency. The IF signal may then be amplified to the desired level in a fixed-frequency IF amplifier. The advantages of this system in receiving radio signals are well known in the art. In converting the radio frequency signal to an intermediate frequency, the selected radio frequency signal and the output of a local oscillator are both applied to a common mixer stage which responds to the two input signals to generate an intermediate frequency signal which represents the difference between the frequencies of the two input signals. However, any RF signals whose frequencies differ from the frequency of the local oscillator by an amount equal to the IF can produce an output from the mixer stage. Since the mixer output and the succeeding IF stages are all tuned to the intermediate frequency, they cannot discriminate between the desired and undesired signals that produce this frequency.

Thus, for example, a superheterodyne receiver tuned to a desired incoming signal of 600 kc., with a local oscillator tuned to a frequency of 1055 kc., which is 455 kc. above that of the desired signal, will produce a beat frequency output from the mixer stage of 455 kc. If an undesired signal having a frequency of 1510 kc. is received at the input of the mixer, this latter signal will also beat with the local oscillator frequency of 1055 kc. to produce an IF signal of 455 kc. This undesired signal is known as the image frequency and will produce image interference in the output of the mixer. The image frequency always differs from the desired signal frequency by an amount equal to twice the value of the intermediate frequency. If the local oscillator is tuned above the desired signal, the image frequency is the desired signal frequency plus twice the intermediate frequency; if the oscillator is tuned below the desired signal, the image frequency is the desired signal frequency minus twice the intermediate frequency.

It will be apparent that the higher the image frequency, as compared to the signal frequency, the greater will be the spacing between the desired signal and the image and, therefore, the easier it will be for the tuned circuits preceding the mixer stage to suppress the image frequency. For an intermediate frequency of 455 kc., the images of all but the lowest frequencies in the broadcast band (550 to 1600 kc.) fall outside the response bands. For those frequencies for which the image falls within the broadcast band, the relative frequency separation between the desired and the image signals is so great that the image response of the tuned circuits is negligible. Use of the same intermediate frequency of 455 kc. in the short-wave band (6 to 30 mc.), where the carrier to information bandwidth frequency ratio is large, however, can cause bad image interference. For a signal of 20 mc., for example, the relative frequency spacing between the desired and the image signals will only be about 4.5%. In such applications, the center frequency of the last IF filter is made comparatively low to accommodate a narrow bandpass, and this reduces much of the image interference. However, the tuned circuits of the receiver must be extremely selective to discriminate between signals separated by this small relative frequency difference, and, because of drift problems and the like, new problems arise to reduce the reliability of the receiver. Therefore, to assure reliable reception of desired signals another scheme must be devised to suppress the image. For applications in the range from approximately 6 to 30 megacycles (mc.) and also for very high frequencies, double conversion is sometimes used to overcome the problems that arise in trying to discriminate between such signals. In a typical double conversion receiver, the incoming signal first is converted to an intermediate frequency between 5 and 10 mc., and, after amplification, the resultant signal is again converted to a lower IF of 445 kc. In this way sufficient relative separation can be maintained between the signal and image frequencies to permit the use of tuned circuits in suppressing image frequencies. In the typical dual conversion system, this suppression is accomplished by designing the antenna preselector to achieve adequate suppression of the image associated with the first IF filter center frequency. Similarly, the bandpass of the first IF filter is designed to eliminate the image associated with the second IF filter. However, two independent local oscillators and two IF filters are required, making an unnecessarily complex system.

In many applications, much simplification of the dual conversion scheme can be accomplished. Thus, the present invention provides a circuit for obtaining dual conversion, but is an improvement over the prior dual conversion systems in that it utilizes a single fixed local oscillator frequency, the output of the single local oscillator being inserted at one location into the circuit. This system reduces the first IF filter to a relatively simple trapping network tuned to the image associated with the second conversion process.

It is therefore an object of the present invention to provide a dual conversion superheterodyne receiver for receiving a desired input signal, the receiver using a single local oscillator frequency, the output of the oscillator being applied to the receiver circuit at a single location.

It is a further object of the invention to provide a dual conversion receiver wherein the first IF filter can be reduced to a simple bridge trap combination capable of rejecting the image frequency and unwanted mixer stage products in the system.

Briefly, the present system receives a selected input signal at frequency $f_c$, which signal is mixed with the local oscillator signal $f_{LO}$ in the first mixer stage. The output of the first mixer will contain the input signal $f_c$, the local oscillator signal $f_{LO}$, the sum of these signals, and the difference of these two signals. In addition, various harmonics will appear. The output of the first mixer is applied to an image trapping filter which constitutes a high Q bridged T trap tuned to the image associated with the second mixer process, permitting the signals $f_{LO}$ and the difference signal $(f_c-f_{LO})$ from the mixer to pass through to a second mixer. This second mixer stage again mixes the two preserved input signals to produce sum and difference signals. If a value for the frequency of the local oscillator is fixed, two values for the frequency of the input signal $f_c$ will fulfill the desired mixing process. The second mixer stage will have an output for each of these two possible values of the input signal frequency $f_c$. These two values can arbitrarily be defined as the intended receiving frequency and the image frequency.

The novel features and objects which are characteristic of the present invention are set forth with particularity in the appended claims, but the objects of the invention will be understood more clearly and fully from the following detailed description, taken in connection with the accompanying drawings in which:

Figures 1, 1A, 1B, 1C:
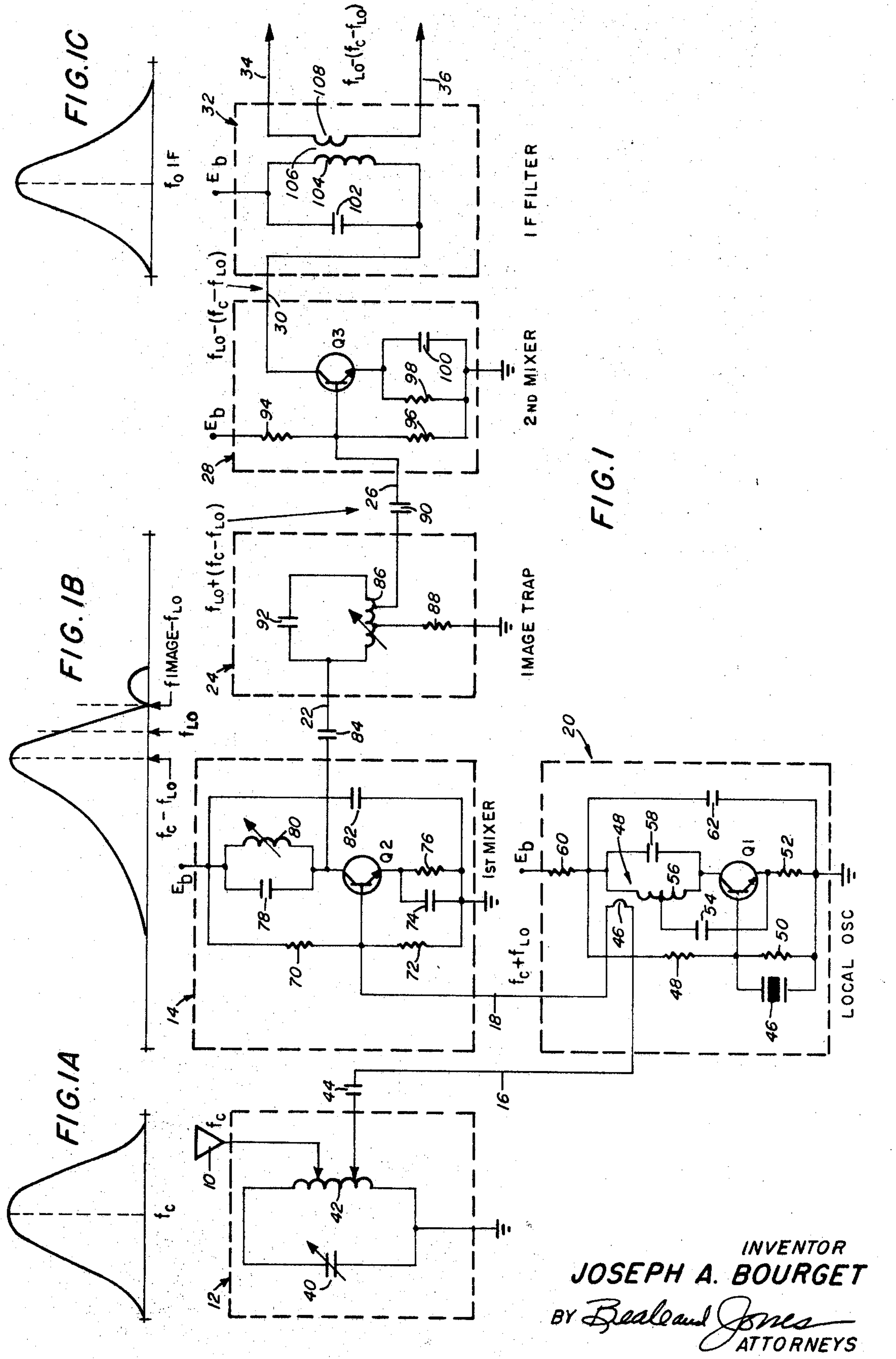
FIG. 1 is a schematic diagram of a dual conversion system in accordance with the present invention.
FIG. 1A illustrates the bandpass characteristics of the preselector tuned circuit of the system of FIG. 1.
FIG. 1B illustrates the bandpass characteristics of the first filter trap of the circuit of FIG. 1.
FIG. 1C illustrates the bandpass characteristics of the second filter network.

Referring now to the schematic diagram of FIG. 1, which is a preferred embodiment of the present invention, there is illustrated a dual conversion system which receives a radio frequency signal at antenna 10 and feeds such a signal through a tunable preselector filter 12 to a first mixer 14 by way of lead lines 16 and 18. A local oscillator 20 superimposes its output on the input radio frequency signal appearing on line 16 and the combined signals are applied by way of line 18 to the input of the first mixer 14.

As indicated, the desired input signal is selected by the preselector filter 12 by tuning it to the desired input frequency. The filter 12 has the bandpass characteristic illustrated in FIG. 1A, the center frequency $f_c$ being selected by tuning the filter. Normally this filter would have a bandwidth of about 3 db., which is usually adequate to pass the information bandwidth which is to be accepted by the receiver, while rejecting the image frequencies associated with the first mixer. This input signal $f_c$ is applied through lines 16 and 18 to the input of the first mixer 14, while the output of the local oscillator, which is fixed at frequency $f_{LO}$, is also applied through line 18 to the input of mixer 14. The output of the first mixer will contain the following frequency components: the center frequency $f_c$; the local oscillator frequency $f_{LO}$; the sum of the frequencies, $f_c+f_{LO}$; the difference of the frequencies, $f_c-f_{LO}$; certain image components; and several other products generated by the harmonics of the foregoing signals.

The output of the first mixer 14 is fed through line 22 to an image trap 24 where the undesired signals representing the image frequencies are removed. The image trap has a bandpass characteristic such as that illustrated in FIG. 1B whereby it will pass the desired frequencies $f_{LO}$ and $(f_c-f_{LO})$ while presenting a high impedance to undesired signals having a frequency $(f_{image}-f_{LO})$. The output of the image trap which appears on line 26 thus consists of the selected components $f_{LO}$ and the difference frequency $(f_c-f_{LO})$. These components are fed from line 26 to the input of a second mixer circuit 28 in which the dual conversion is completed. The output of the second mixer, which appears on line 30, is comprised of a signal having the following components:

$$f_{LO}-(f_c-f_{LO})=\pm f_o$$

where $f_o$ is the center frequency of the filter following the second mixer.

The output appearing on line 30 is at a frequency distinct from those which are applied to the input of second mixer 28 and thus the dual conversion is satisfied. If a value for $f_{LO}$ is fixed, two values for the input signal $f_c$ will satisfy the mixing process and thus the output of the second mixer will have an output for each of these two possible values of $f_c$. These two values of $f_c$ can arbitrarily be defined as the intended receiving frequency and the undesired image frequency. In a practical system one of the possible values of $f_c$ must be eliminated if the image is to be rejected. The choice of eliminating one or the other of these values of $f_c$ is determined by practical operation environment considerations, where an image either higher or lower than the intended receiving frequency may be preferred.

The value of the output signal from local oscillator 20 is determined from the preceding equation from which it can be determined that:

$$f_{LO}=\tfrac{1}{2}(f_c\pm f_o)$$

where the image is intended to be higher than the selected carrier signal input frequency, the output of the local oscillator must meet the following conditions:

$$f_{LO}=\tfrac{1}{2}(f_c+f_o)$$

For the case where the image is preferred at a frequency lower than the input carrier frequency $f_c$, the following conditions must be met:

$$f_{LO}=\tfrac{1}{2}(f_c-f_o)$$

The signal appearing on line 30 represents the desired signal. To insure that no other frequencies appear at the output of the circuitry, this signal is passed through an IF filter 32 having a bandpass characteristic such as that illustrated in FIG. 1C. This filter passes only the desired frequency and, although it has a narrow bandpass characteristic, is adequate to pass the information received, and provides the required selectivity.

As an illustration of the foregoing, the following example is presented. As stated above, the value of $f_{LO}$ may be determined from the relationship $$2f_{LO}=f_c+f_o$$

where $f_o$ is the center frequency of filter 32, as shown in FIG. 1C. The image of most significance in the system is $f_c+2f_o$. If the received signal frequency $f_c$ is equal to 100 mc., and the bandpass of IF filter 32 has a center frequency $f_o$ equal to 2 mc. (which is the intermediate frequency output signal) then the frequency of the local oscillator 20 can be determined as follows:

$$f_{LO}=\tfrac{1}{2}(f_c+f_o)$$
$$=\tfrac{1}{2}(100+2)=51\text{ mc.}$$

From this, it is seen that the desired difference frequency mixer output signal is $$f_c-f_{LO}=100-51=49\text{ mc.}$$

and the received image frequency of interest becomes:

$$f_{image}=f_c+2f_o=100+4=104\text{ mc.}$$

Where the image trap 24 is designed to have a characteristic such as that shown in FIG. 1B, the desired output signal at the center frequency $f_c-f_{LO}=49$ mc. will be passed by the filter 24. Further, the filter 24 will pass the local oscillator frequency $f_{LO}=51$ mc. One of the undesired signals at the output of the first mixer is the "difference" signal resulting from the mixing of a received image and the local oscillator. To remove this image signal, the filter is designed to have a trap at:

$$f_{image}-f_{LO}=(f_c+2f_o)-f_{LO}$$
$$=(100+4)-51=53\text{ mc.}$$

thus attenuating signals at 53 mc. The difference signal output of the second mixer, which results from a mixing of $f_{LO}$ and $(f_c - f_{LO})$, is the second IF frequency:

$$f_{LO} - (f_c - f_{LO}) = f_o$$
$$51 - (100 - 51) = 2 \text{ mc.}$$

Referring now to the circuit of FIG. 1 in more detail, the preselector filter 12 is comprised of a variable capacitor 40 and a tapped inductor 42 connected in parallel with one junction of the connection being connected to ground. Antenna 10 is connected to one tap on inductor 42 while the output of the filter is obtained from the other tap. As is well known in the art, the values selected for this LC filter are such as to provide a relatively narrow bandpass characteristic, with the peak response being the frequency which it is desired to receive. Of course, it is not possible to build a practical filter that will completely eliminate undesired frequencies from passing through the preselector filter; nevertheless the filter substantially reduces the number of such frequencies.

The output of filter 12 passes through a coupling capacitor 44, line 16, the secondary winding 46 of transformer 48 in local oscillator 20, and through line 18 to the input of the first mixer.

The local oscillator 20 generates a frequency $f_{LO}$ which is of a fixed value determined by a crystal 46 connected between the base of a transistor Q1 and ground. A voltage divider comprised of resistors 48 and 50 is connected between a resistor 60 and ground, the resistor 50 being connected across crystal 46 and the junction of resistors 48 and 50 being connected to the base of transistor Q1. The emitter of Q1 is connected through resistor 52 to ground and through a capacitor 54 to a tap on the primary winding 56 of transformer 48. The parallel combination of the primary winding 56 and capacitor 58 is connected between the collector of Q1 and the source of bias voltage $E_b$ by way of temperature stabilizing resistor 60. A capacitor 62 is connected between ground and the junction of bias resistor 60 with the parallel LC circuit. The output of the oscillator is obtained by way of the secondary winding 46 of transformer 48 and is applied through line 18 to the base of transistor Q2 in the first mixer 14.

The base of transistor Q2 in mixer 14 is connected to the junction of voltage divider resistors 70 and 72 which are connected between a source of bias voltage $E_b$ and ground. The emitter of Q2 is connected through a parallel RC network, comprised of a capacitor 74 and a resistor 76, to ground, while the collector of Q2 is connected through a parallel LC network comprised of a capacitor 78 and a variable inductor 80 to the source of bias voltage. Capacitor 82 is connected between the bias source and ground. Mixer 14 receives the input signals from the antenna and from the local oscillator and mixes them in known manner to produce an output signal at the collector of Q2 which varies in accordance with the modulation applied to the base of Q2 by the input signals. This output voltage is applied through a coupling capacitor 84 to the image trap 24.

The image trap includes a double tapped variable inductor 86, one of the taps being connected through a resistor 88 to ground and the other tap being connected through coupling capacitor 90 to line 26 and thence to the input of the second mixer. Bridged across variable inductor 86 is a capacitor 92. The trap is tuned by means of variable inductor 86 to attenuate the signal frequency which is to be rejected; i.e., is tuned to the frequency of the image signal.

The output of image trap 24 is applied by way of line 26 to the base of transistor Q3 in the second mixer 28. Voltage divider resistors 94 and 96 are connected between the source of bias voltage and ground with their junction being connected to the base of transistor Q3. The emitter of Q3 is connected through the parallel RC network comprised of resistor 96 and capacitor 100 to ground, while the collector of Q3 is connected by way of line 30 to the input of the IF filter 32. The second mixer receives the signal components $f_{LO}$ and $(f_c - f_{LO})$ and it mixes them in known manner to obtain the desired output frequency $$f_{LO} - (f_c - f_{LO})$$

Undesired output signals from the second mixer are prevented from reaching output terminals 34 and 36 by the IF filter network 32. This filter is comprised of a parallel LC network connected between line 30 and the source of bias voltage $E_b$, the network including a capacitor 102 and an inductor 104, the inductor being the primary winding of an IF transformer 106. Output terminals 34 and 36 are connected across the secondary 108 of the IF transformer.

Thus, there has been illustrated a system whereby dual conversion of a selected radio frequency signal can be achieved in a receiver through the use of a single local oscillator frequency, the output of the local oscillator being inserted at a single location into the circuit to eliminate the need for the usual first IF filter, substituting a single image trap therefor. Since various modifications of this system will be apparent to those skilled in the art, it is desired that the foregoing description be taken as illustrative, the scope of the invention being limited only by the following claims.

I claim:

1. A dual conversion system for radio receivers comprising means for receiving a selected radio frequency signal; single local oscillator means generating a single fixed frequency signal; first mixer means; means for applying said radio frequency signals and the output of said local oscillator means to the input of said first mixer means only; second mixer means; image trap means for applying selected components of the output of said first mixer means to the input of said second mixer means; and intermediate frequency filter means connected to the output of said second mixer means, whereby undesired frequency components of the received radio frequency signals are rejected.

2. The dual conversion system of claim 1, wherein said means for receiving a selected radio frequency signal includes tunable preselector filter means.

3. The dual conversion system of claim 1, wherein said local oscillator means includes a tuned circuit comprised of the parallel connection of a capacitor and the primary winding of a transformer, said means for applying said selected radio frequency signal and the output of said local oscillator means to the input of said first mixer means including the secondary winding of said transformer.

4. The dual conversion system of claim 1, wherein said image trap means for applying selected components of the output of said first mixer means to the input of said second mixer means comprises a high Q, bridged T network consisting of a variable inductor having first and second taps, a capacitor connected in shunt with said variable inductor, and a resistor connected between said first tap and a ground reference point, the output of said image trap being obtained from said second tap.

5. The dual conversion system of claim 1, wherein said intermediate frequency filter means includes a transformer having a primary winding connected to the output of said second mixer means, a secondary winding, and a capacitor connected across said primary winding, the output of said system appearing across said secondary winding.

6. The dual conversion system of claim 3, wherein said local oscillator means comprises a crystal-controlled oscillator.

7. The dual conversion system of claim 3, wherein said image trap means for applying selected components of the output of said first mixer means to the input of said second mixer means comprises a high Q, bridged T trap including a variable inductor having first and second taps, a capacitor connected across said variable inductor, and a resistor connected between said first tap and a ground reference, the output of said image trap being obtained from said second tap.

8. The dual conversion system of claim 7, wherein said intermediate frequency filter means includes a transformer having a primary winding connected to the output of said second mixer means and a secondary winding, and a capacitor connected across said primary winding, the output of said system appearing across said secondary winding.

9. The dual conversion system of claim 8, wherein said first mixer means includes a transistor having base, emitter and collector electrodes, said base electrode comprising the input of said mixer, said emitter electrode being connected through a parallel resistor-capacitor network to said ground reference, and said collector electrode being connected through a parallel capacitor-variable inductor network to a source of bias voltage, the output of said first mixer means being obtained from the collector electrode of said transistor.

10. The dual conversion system of claim 9, wherein said second mixer includes a second transistor having base, emitter and collector electrodes, said second base electrode comprising the input of said second mixer, said second emitter electrode being connected through a second parallel resistor-capacitor network to said ground reference, the output of said second mixer means being obtained from the collector electrode of said second transistor.

References Cited

UNITED STATES PATENTS

| | | | |
|---|---|---|---|
| 1,918,433 | 7/1933 | Smythe | 325—434 |
| 2,115,676 | 4/1938 | Wheeler | 325—434 XR |
| 2,154,073 | 4/1939 | Koch | 325—434 XR |
| 2,534,606 | 12/1950 | Kolster | 325—434 XR |
| 2,715,180 | 8/1955 | Beers | 325—434 XR |
| 2,855,456 | 10/1958 | Morrison | 325—434 XR |

ROBERT L. GRIFFIN, Primary Examiner

R. S. BELL, Assistant Examiner

U.S. Cl. X.R.

325—437